US008817997B2

(12) United States Patent
Kutuzov et al.

(10) Patent No.: US 8,817,997 B2
(45) Date of Patent: Aug. 26, 2014

(54) STEREOPHONIC SOUND OUTPUT APPARATUS AND EARLY REFLECTION GENERATION METHOD THEREOF

(75) Inventors: Denis Kutuzov, Suwon-si (KR); Chul-min Choi, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1332 days.

(21) Appl. No.: 11/869,964

(22) Filed: Oct. 10, 2007

(65) Prior Publication Data

US 2008/0205675 A1 Aug. 28, 2008

(30) Foreign Application Priority Data

Feb. 27, 2007 (KR) ........................ 10-2007-0019779

(51) Int. Cl.
*H03G 3/00* (2006.01)
*H04R 5/02* (2006.01)

(52) U.S. Cl.
USPC ................ 381/63; 381/61; 381/309; 381/310

(58) Field of Classification Search
CPC ........ G10K 15/10; G10K 15/08; G10K 15/12; H04S 7/305; H04S 2420/01; H04S 5/00
USPC ................................ 381/63, 310, 309, 61, 17
See application file for complete search history.

(56) References Cited

U.S. PATENT DOCUMENTS 6,385,320 B1 5/2002 Lee
6,990,205 B1 1/2006 Chen
7,536,021 B2 * 5/2009 Dickins et al. ................ 381/310
8,027,477 B2 * 9/2011 Wang .............................. 381/17
2002/0067836 A1 6/2002 Paranjpe
2003/0202665 A1 10/2003 Lin et al.
2006/0045274 A1 3/2006 Aarts et al.
2006/0115091 A1 6/2006 Kim et al.
2006/0198527 A1 9/2006 Chun

FOREIGN PATENT DOCUMENTS

KR 10-2001-0030608 A 4/2001
KR 10-2006-0059147 A 6/2006
WO 99-14983 A1 3/1999

OTHER PUBLICATIONS

Schroeder, M. R., "Natural Sounding Artificial Reverberation", Journal of the Audio Engineering Society, Jul. 1962, vol. 10, No. 3, pp. 219-223.

* cited by examiner

*Primary Examiner* — Xu Mei
*Assistant Examiner* — Douglas Suthers
(74) *Attorney, Agent, or Firm* — Jefferson IP Law, LLP

(57) ABSTRACT

A stereophonic sound output apparatus and an early reflection generation method thereof. The stereophonic sound output apparatus includes an early reflection generator to implement an early reflection when a 5.1 channel audio signal is down-mixed to a 2-channel audio signal to play back a 5.1 channel audio signal through a 2-channel headphone. The early reflection generator generates early reflections in pairs in which there is an appropriate time difference between the left side reflections and the right side reflections by generating an interaural time difference between two input audio signals and filtering. It is possible to copy the characteristics of early reflections in a real listening room. It is also possible to implement an early reflection similar to a real reflection measured in an apparatus for playing back the 5.1 channel audio signal through 2-channel headphone. A natural 5.1 channel effect may also be obtained using little computation.

18 Claims, 6 Drawing Sheets

STEREOPHONIC SOUND OUTPUT APPARATUS AND EARLY REFLECTION GENERATION METHOD THEREOF

CROSS-REFERENCE TO RELATED APPLICATIONS

This application claims all benefits accruing under 35 U.S.C. §119 from Korean Patent Application No. 2007-19779, filed in the Korean Intellectual Property Office on Feb. 27, 2007, the entire disclosure of which is incorporated herein by reference.

BACKGROUND OF THE INVENTION

1. Field of the Invention

Aspects of the present invention relate to an apparatus and a method of outputting stereophonic sound, and more particularly, to an apparatus and a method of outputting stereophonic sound in which a 5.1 channel audio signal is down-mixed to a 2-channel audio signal to be output to headphones.

2. Related Art

As digital stereophonic systems, such as digital broadcasting and digital video disc (DVD) players, have become widely used, 5.1 channel sound also is being commonly utilized. The 5.1 channel sound may be played back through a sound system that is arranged according to a user's needs, and provides three-dimensional stereophonic sound to the user. Since output devices of sound systems, such as computers or portable sound apparatuses, can output 2-channel sounds through two speakers, the 5.1 channel audio signal is down-mixed in these systems to a 2-channel audio signal using a predetermined signal process in order to enjoy the 5.1 channel sound.

FIGS. 1A and 1B are diagrams explaining a conventional method of outputting a stereophonic sound. In FIG. 1A, speakers 2, 3, 4, 5, and 6 are arranged around a center where a user 1 is located. A sub woofer (not shown) may be placed in various positions. The user 1 may listen to 5.1 channel stereophonic sound through the speakers 2, 3, 4, 5 and 6, as shown in FIG. 1A, and the sub woofer (not shown). A binaural impulse response is measured when the sound is transferred from each of the speakers 2, 3, 4, 5 and 6 to the user 1.

FIG. 1B is a block diagram schematically showing a stereophonic sound output apparatus that down-mixes a conventional 5.1 channel audio signal to a 2-channel audio signal to be output. In FIG. 1B, an audio signal FL output from the speaker 3 disposed at the front left side, an audio signal FR output from the speaker 4 disposed at the front right side, an audio signal RL output from the speaker 5 disposed at the rear left side, an audio signal RR output from the speaker 6 disposed at the rear right side, and an audio signal C output from the speaker 2 disposed at the center are transmitted to a FL synthesizer 10, a FR synthesizer 20, a RL synthesizer 30, a RR synthesizer 40, and a C synthesizer 50, respectively.

The synthesizers 10, 20, 30, 40, and 50 individually convolute each audio signal with the binaural impulse response measured in FIG. 1A. Adders 70 and 80 mix the audio signals output from each of the synthesizers 10, 20, 30, 40, and 50, and output 2-channel audio signals LEFT and RIGHT. An audio signal SW output from the sub woofer (not shown) is a 0.1-channel audio signal with a low frequency having a wavelength much larger than the size of the head of the user 1. The audio signal SW is mixed and output by the adders 70 and 80 without convolution of the binaural impulse response.

Since ten (10) impulse responses having a length corresponding to the reverberation time of a space are convoluted by the audio signals output respectively through the speakers 2, 3, 4, 5, and 6 as described in connection with FIG. 1A, memory usage and computation times are high. A simplified method is described in Schroeder, M. R., "Natural Sounding Artificial Reverberation", J. Audio Engineering Society, Vol. 10, No. 3 (1962). Schroeder's reverberation device has a simple structure, and the reverberation is obtained using less computation. However, the frequency characteristics are not smooth, and unnatural sound is output due to a high regularity of reflection time delay.

Additionally, in the case of a reflection generated in a real room, a single reflection enters both ears. However, in the case of headphones, if there is no pair of reflections played back through each channel formed taking an interaural time difference (ITD) between two channels into consideration, a group of unnatural early reflections may be formed differently from the reflection generated in real rooms. This is because, in the case of the headphones, signals played back through each channel do not enter different ear pieces.

SUMMARY OF THE INVENTION

Aspects of the present invention relate to an apparatus and a method of outputting stereophonic sound, in which a natural 5.1 channel effect is provided by implementing an early reflection synthesizer with low computation time to generate a group of early reflections in pairs taking into consideration an interaural time difference (ITD) between both channels, in order to effectively implement an apparatus for down mixing a 5.1 channel audio signal to a 2-channel audio signal and outputting 5.1 channel stereophonic sound through headphones.

According to an aspect of the present invention, a stereophonic sound output apparatus is provided. The apparatus includes a direct sound generator to convolute a head related transfer function (HRTF) to a plurality of audio signals and to localize each of the plurality of audio signals; a first adder to combine the plurality of audio signals into a first audio signal; an early reflection generator to divide the first audio signal into two audio signals, and to generate an interaural time difference (ITD) between the two audio signals; a second adder to combine the audio signals output from the direct sound generator and the early reflection generator into a second audio signal; and a third adder to combine the audio signals output from the direct sound generator and the early reflection generator into a third audio signal a.

According to another aspect of the present invention, the early reflection generator includes an HRTF unit to generate an interaural time difference (ITD) between the two audio signals; a diffusing unit to filter the two audio signals output from the HRTF unit through all-pass filters (APFs); and a reverberating unit to exchange the two audio signals output from the diffusing unit when the two audio signals are received as feedback.

According to another aspect of the present invention, the HRTF unit includes a first low pass filter (LPF) to low pass filter one of the two audio signals, a second LPF to low pass filter the other of the two audio signals; and a delay unit to delay the audio signal filtered through the first LPF for a predetermined period of time and to output the delayed signal.

According to another aspect of the present invention, the diffusing unit includes a first APF having a first delay value and a first gain value to filter one of the two audio signals; and a second APF having a second delay value and a second gain value to filter the other of the two audio signals.

According to another aspect of the present invention, the reverberating unit includes two APFs having a third delay value, and the two APFs may exchange audio signals received as feedback by reducing the sizes of the two audio signals by a third gain value and a fourth gain value, respectively.

According to another aspect of the present invention, a stereophonic sound output apparatus is provided. The apparatus includes a head related transfer function (HRTF) unit to generate an interaural time difference (ITD) between two audio signals; a diffusing unit to filter the two audio signals output from the HRTF unit through all-pass filters (APFs); and a reverberating unit to exchange the two audio signals output from the diffusing unit when they are received as feedback.

According to another aspect of the present invention, an early reflection generation method to generate stereophonic sound signals from a plurality of multi-channel sound signals is provided. The method includes generating an interaural time difference (ITD) between two audio signals; filtering the two audio signals through all-pass filters (APFs); and exchanging the two filtered audio signals received as feedback.

According to another aspect of the present invention, the generating of the ITD includes low pass filtering the two audio signals; delaying one of the two audio signals for a predetermined period of time; and outputting the delayed signal.

According to another aspect of the present invention, the filtering of the two audio signals includes filtering one of the two audio signals through a first APF having a first delay value and a first gain value; and filtering the other of the two audio signals through a second APF having a second delay value and a second gain value.

According to another aspect of the present invention, the exchanging of the two filtered audio signals includes exchanging audio signals received as feedback by reducing the sizes of the audio signals using two APFs having a third gain value and a fourth gain value when filtering the audio signals through the two APFs having a third delay value.

In addition to the example embodiments and aspects as described above, further aspects and embodiments will be apparent by reference to the drawings and by study of the following descriptions.

BRIEF DESCRIPTION OF THE DRAWINGS

A better understanding of the present invention will become apparent from the following detailed description of example embodiments and the claims when read in connection with the accompanying drawings, all forming a part of the disclosure of this invention. While the following written and illustrated disclosure focuses on disclosing example embodiments of the invention, it should be clearly understood that the same is by way of illustration and example only and that the invention is not limited thereto. The spirit and scope of the present invention are limited only by the terms of the appended claims. The following represents brief descriptions of the drawings, wherein:

DETAILED DESCRIPTION OF THE EMBODIMENTS

Figure 1A:
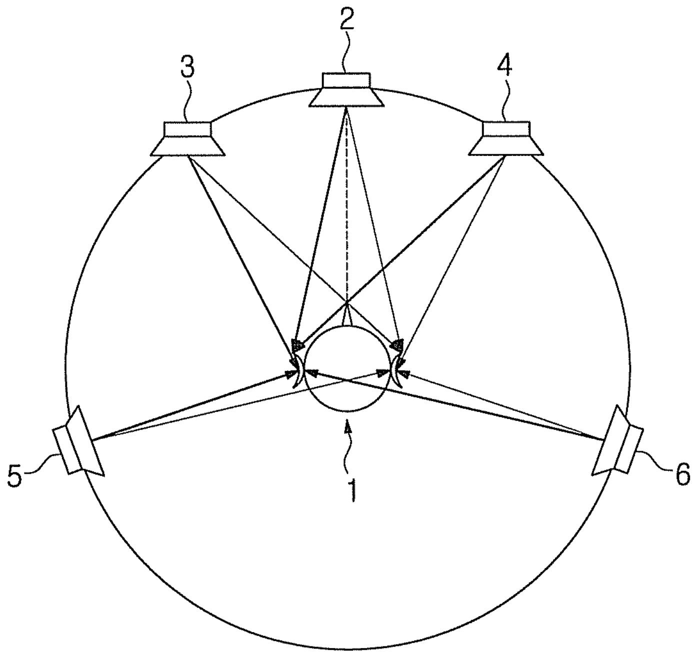
FIG. 1A (PRIOR ART)
FIGS. 1A and 1B are diagrams explaining a conventional method of outputting a stereophonic sound.
Figure 1B:
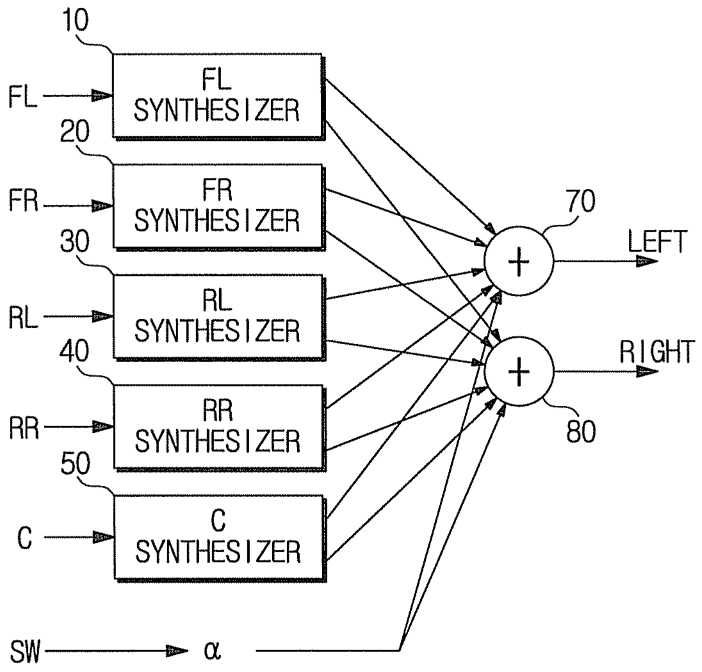
FIG. 1B (PRIOR ART)

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
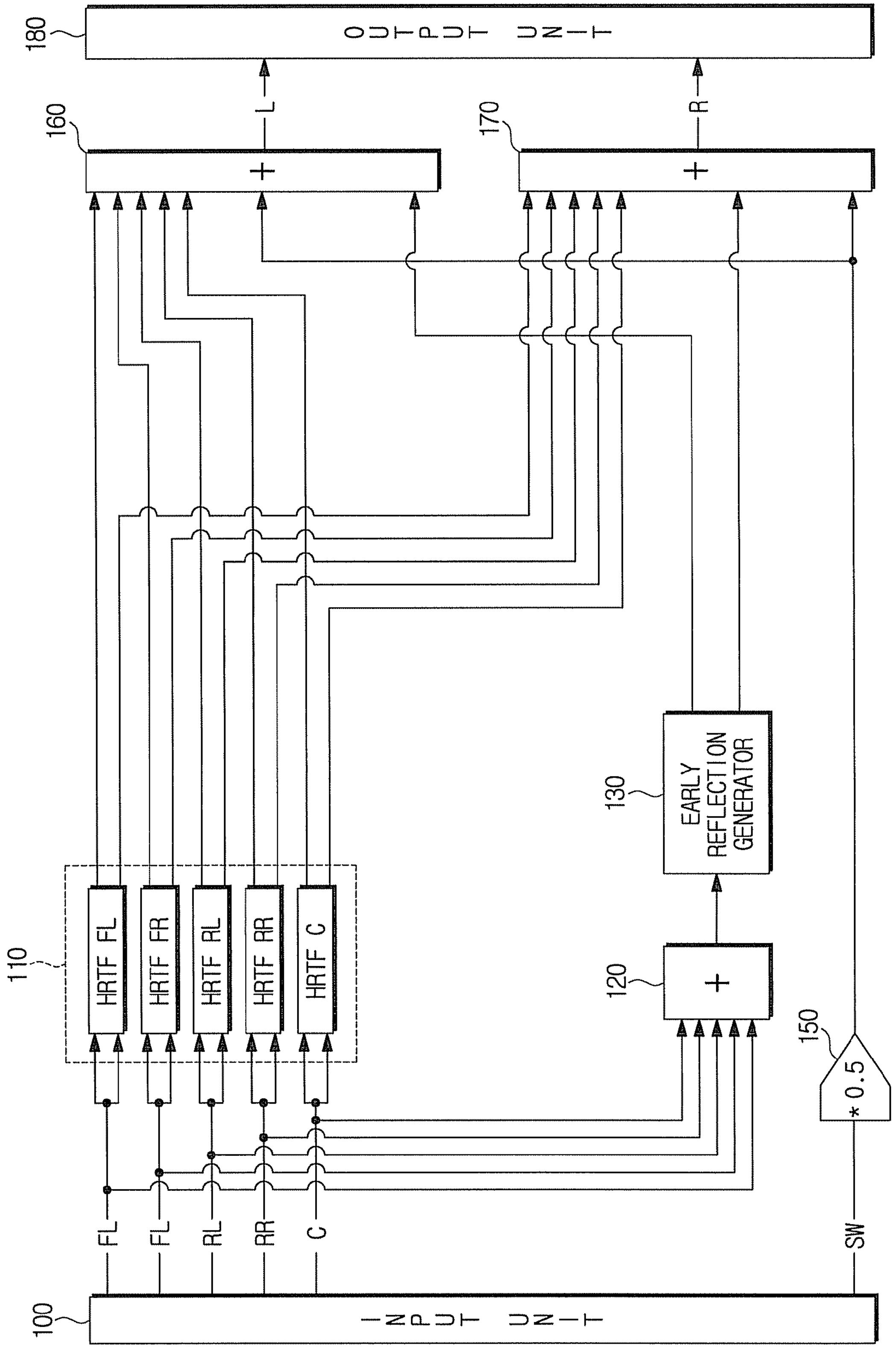
FIG. 2 is a diagram showing a stereophonic sound output apparatus according to an example embodiment of the present invention.

FIG. 2 is a diagram showing a stereophonic sound output apparatus according to an example embodiment of the present invention. The stereophonic sound output apparatus comprises an input unit 100, a direct sound generator 110, a first adder 120, an early reflection generator 130, a sub woofer unit 150, a second adder 160, a third adder 170 and an output unit 180. The stereophonic sound output apparatus according to other aspects of the invention may contain additional or different units. Similarly, one or more of the above units may be combined into a single component. The stereophonic sound output apparatus may be part of a computer, mobile phone, personal digital assistant, personal entertainment device (such as an Apple iPod), or other device capable of outputting stereophonic sound.

Audio signals C, FL, FR, RL and RR input through the input unit 100 are transferred to the direct sound generator 110 and the first adder 120. An audio signal SW input through the input unit 100 is transferred to the sub woofer unit 150.

The direct sound generator 110 convolutes a head related transfer function (HRTF) to the audio signals C, FL, FR, RL and RR, and localizes each of the audio signals C, FL, FR, RL and RR. Each of the audio signals C, FL, FR, RL and RR is divided into two audio signals, the divided signals are processed by the direct sound generator 110, and the processed signals are combined into two audio signals to be output.

The HRTF describes the relative position of the sound source and the ears of the user, the change of tones affected by the head and body, and the negative phase difference between the ears of the user. A result measured in an anechoic chamber that provides a reflection-free environment or a result obtained by computation as a numerical model may be used as the HRTF.

The first adder 120 combines the audio signals C, FL, FR, RL and RR input through the input unit 100 into a single audio signal and outputs the single audio signal. The early reflection generator 130 divides the audio signal output from the first adder 120 into two audio signals, and then generates an interaural time difference (ITD) between the two audio signals. Additionally, the early reflection generator 130 generates and outputs an audio signal having a rich volume by increasing the density of the audio signal. The sub woofer unit 150 applies a gain value of *0.5 to a 0.1-channel audio signal SW, divides and outputs the audio signal SW to both channels.

The second adder 160 adds the audio signals output from the direct sound generator 100, the early reflection generator 130, and the sub woofer unit 150, and outputs an audio signal L to a left side speaker or to a left side headphone. The third adder 170 adds the audio signals output from the direct sound generator 100, the early reflection generator 130, and the sub woofer unit 150, and outputs an audio signal R to a right side speaker or to a right side headphone. The output unit 180 outputs the audio signals L and R output from the second and third adders 160 and 170 as a left side sound and a right side sound, respectively. The output unit 180 may be, for example, a pair of speakers or a pair of headphones, or may be an output port to which speakers, headphones, or the like may be attached.

Figure 3A:
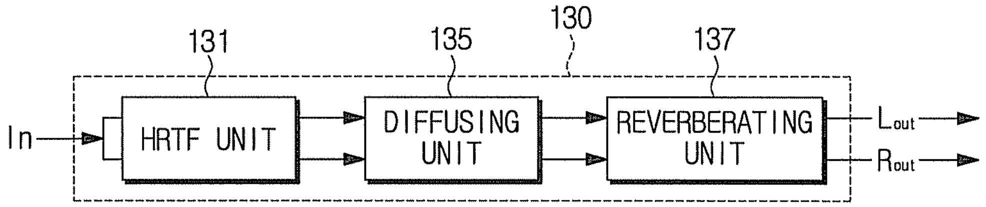
FIG. 3A is a block diagram schematically showing an early reflection generator of the stereophonic sound output apparatus according to an example embodiment of the present invention.

FIG. 3A is a block diagram schematically showing the early reflection generator 130 of the stereophonic sound output apparatus according to an example embodiment of the present invention. The early reflection generator 130 comprises an HRTF unit 131, a diffusing unit 135, and a reverberating unit 137.

The HRTF unit 131 filters two audio signals through a low pass filter (LPF) and generates an interaural time difference (ITD) corresponding to an angle θ between the two filtered audio signals. According to other aspects of the invention, the two audio signals may be filtered through a finite impulse response (FIR) filter, instead of the LPF. The diffusing unit 135 filters and outputs the two audio signals output from the HRTF unit 131 using two all-pass filters (APFs) having different delay values and different gain values.

The reverberating unit 137 filters the two audio signals output from the diffusing unit 135 using two APFs having the same delay value and the same gain value. The two APFs used by the reverberating unit 137 are configured to exchange feedback values and to increase the density of reflections.

Figure 3B:
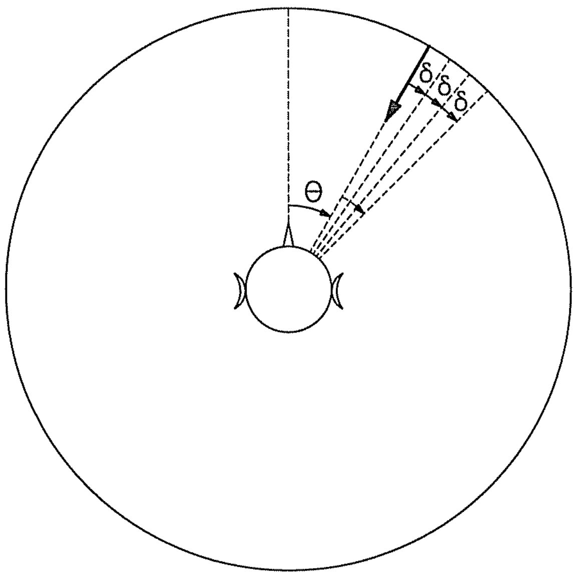
FIG. 3B is a view showing reflection incidence angles of the early reflection generator of the stereophonic sound output apparatus according to an example embodiment of the present invention.

FIG. 3B is a view showing reflection incidence angles of the early reflection generator 130. As shown in FIG. 3B, θ represents an incidence angle of a first reflection, and δ represents a difference between delay values of the two APFs used by the diffusing unit 135. Accordingly, a second reflection, a third reflection, a fourth reflection, and an $n^{th}$ reflection may have incidence angles of θ+δ, θ+2δ, θ+3δ, . . . , θ+(n−1)δ, respectively. If an incidence angle of a reflection is approximately 90°, an interaural time difference (ITD) generated by the head may reach the maximum value, and if an incidence angle of a reflection is 90° or greater, it may be impossible to define the orientation.

Figure 4:
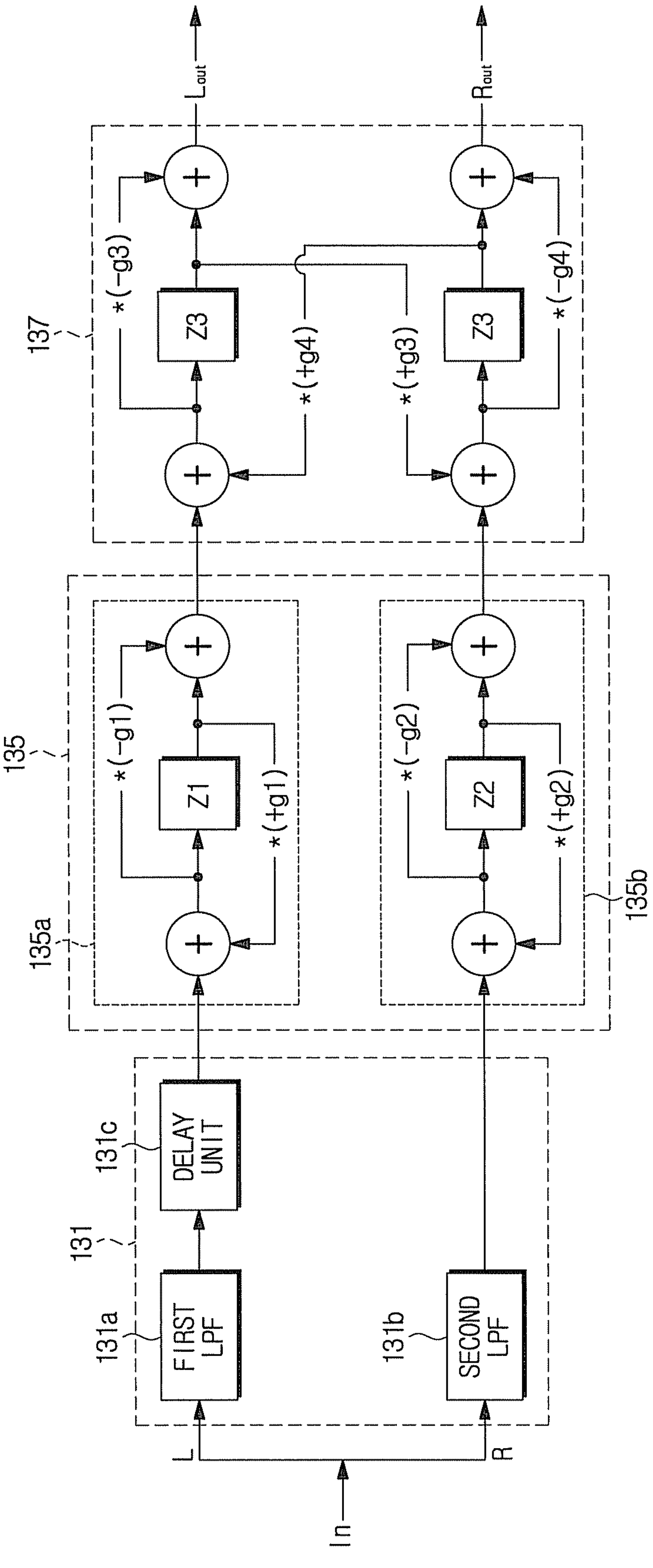
FIG. 4 is a diagram showing in detail the early reflection generator of the stereophonic sound output apparatus according to an example embodiment of the present invention.

FIG. 4 is a diagram showing in detail the early reflection generator 130 of the stereophonic sound output apparatus according to an example embodiment of the present invention. In FIG. 4, the HRTF unit 131 comprises a first LPF 131*a*, a second LPF 131*b* and a delay unit 131*c*.

The first and second LPFs 131*a* and 131*b* filter each of two input audio signals and replicate change of frequency caused by the user's head. The delay unit 131*c* delays one of two audio signals by an interaural time difference (ITD) between the ears of the user, and outputs the delayed signal. In the HRTF unit 131 shown in FIG. 4, the left side audio signal L is delayed by the interaural time difference (ITD) between the ears of the user to generate an early reflection having an incidence angle of θ in a predetermined direction. According to other aspects of the present invention, the right side audio signal R may be delayed.

The diffusing unit 135 comprises a first APF 135*a* and a second APF 135*b*. A first delay value Z1 of the first APF 135*a* and a second delay value Z2 of the second APF 135*b* have a difference value δ shown in FIG. 3B. Each of Z1 and Z2 may be approximately 5 to 10 ms, and Z1 is greater than Z2 by a time delay a corresponding to δ. Accordingly, the time delay a accumulates every time Z1 and Z2 are applied to the audio signals output from the HRTF unit 131, and thus the incidence angles may be greater. If an incidence angle of a first reflection is θ, a second reflection, a third reflection, a fourth reflection, and an $n^{th}$ reflection may have incidence angles of θ+δ, θ+2δ, θ+3δ, . . . , θ+(n−1)δ, respectively. Accordingly, the reflections may have an increasingly large incidence angle.

In addition, a first gain value g1 and a second gain value g2 individually have a value between approximately 0 and 1, and the sizes of audio signals are reduced by g1 and g2 every time Z1 and Z2 are applied to the audio signals. If an incidence angle of a reflection is 90° or greater, it may be impossible to define the orientation. However, it is possible to provide a sufficient reflection density temporally, and thus the function of a rear reverberating unit (not shown) in the conventional art may be performed.

The reverberating unit 137 comprises two APFs which have the same delay value Z3 and are connected to each other. The reverberating unit 137 increases the density of the reflection. The reverberating unit 137 exchanges audio signals received as feedback by reducing the sizes of the audio signals output from the diffusing unit 135 by a third gain value g3 and a fourth gain value g4 every time Z3 is applied to the audio signals, so that a group of early reflections that is generated according to a result of alternately outputting left-side reflections and right-side reflections can be evenly arranged.

Figure 5:
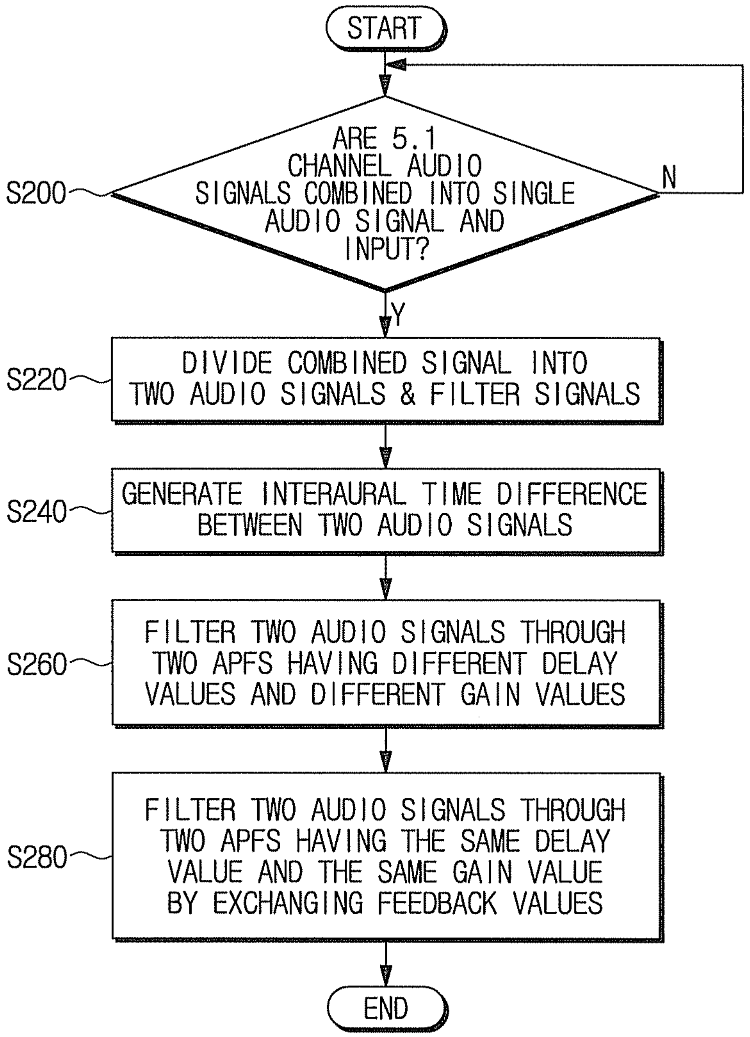
FIG. 5 is a flowchart explaining the operation of the early reflection generator of the stereophonic sound output apparatus according to an example embodiment of the present invention.

FIG. 5 is a flowchart explaining the operation of the early reflection generator 130. In FIG. 5, if 5.1 channel audio signals are combined into a single audio signal and the single audio signal is input by the first adder 120 at block S200, the HRTF unit 131 divides the single audio signal into two audio signals and filters the two audio signals through the first and second LPFs 131*a* and 131*b*, respectively, at block S220. The HRTF unit 131 also generates the interaural time difference (ITD) between the two audio signals filtered by the first and second LPFs 131*a* and 131*b* through the delay unit 131*c* at block S240. At blocks S220 and S240, the HRTF unit 131 determines the incidence angle of the first reflection to be θ.

The diffusing unit 135 filters the two audio signals through two APFs having different delay values and different gain values at block S260. The two audio signals output from the HRTF unit 131 are delayed to have a difference value δ between the two audio signals, and the size of each audio signal is reduced by gain values g1 and g2. Accordingly, the amplitude of reflections having incidence angles of θ+δ, θ+2δ, θ+3δ, . . . , θ+(n−1)δ may decrease.

The reverberating unit 137 filters the two audio signals using two APFs 135*a* and 135*b* having the same delay value and the same gain value by exchanging feedback values at block S280. The two audio signals output from the diffusing unit 135 are delayed using the same delay value, the delayed signals are exchanged, and the size of each audio signal is then reduced by the same gain value. Therefore, the reflections may be evenly output through the left side and right side headphones with a high density. In the above-described manner, a 5.1 channel audio signal may be down-mixed to a 2-channel audio signal.

According to the example embodiments of the present invention as described above, the early reflection may be implemented using little computation. Additionally, the early reflections may be generated in pairs and may have an appropriate time difference between the left side reflections and the right side reflections taking into consideration the interaural time difference (ITD) between both channels, so it is possible to effectively copy the characteristics of early reflections in a real listening room. Furthermore, according to the above-described method, it is possible to effectively implement an early reflection which is similar to a real reflection measured in an apparatus for playing back the 5.1 channel audio signal through a 2-channel headphone, and a natural 5.1 channel effect may also be obtained using little computation.

The present invention can also be embodied as computer readable codes on a computer readable recording medium. The computer readable recording medium is any data storage device that can store data which can be thereafter read by a computer system. Examples of the computer readable recording medium also include read-only memory (ROM), random-access memory (RAM), CD-ROMs, DVDs, magnetic tapes, floppy disks, optical data storage devices, and carrier waves (such as data transmission through the Internet). The computer readable recording medium can also be distributed over network coupled computer systems so that the computer readable code is stored and executed in a distributed fashion. Also, functional programs, codes, and code segments for accomplishing the present invention can be easily construed by programmers skilled in the art to which the present invention pertains.

While there have been illustrated and described what are considered to be example embodiments of the present invention, it will be understood by those skilled in the art and as technology develops that various changes and modifications, may be made, and equivalents may be substituted for elements thereof without departing from the true scope of the present invention. Many modifications, permutations, additions and sub-combinations may be made to adapt the teachings of the present invention to a particular situation without departing from the scope thereof. For example, any type of multi-channel sound, not simply 5.1 stereophonic sound, may be down-mixed using aspects of the present invention. Accordingly, it is intended, therefore, that the present invention not be limited to the various example embodiments disclosed, but that the present invention includes all embodiments falling within the scope of the appended claims.

What is claimed is:

1. A stereophonic sound output apparatus comprising:

a direct sound generator device to localize each of a plurality of audio signals using a first head related transfer function (HRTF) for each of the plurality of audio signals;

a first adder device to generate a first audio signal by combining the plurality of audio signals;

an early reflection generator device to generate two early reflection audio signals by dividing the first audio signal into two audio signals using a second head related transfer function (HRTF), wherein the two early reflection audio signals have an interaural time difference (ITD);

a second adder device to generate a second audio signal by combining some of the localized plurality of audio signals output from the direct sound generator and one of the two early reflection audio signals output from the early reflection generator; and a third adder device to generate a third audio signal by combining other of the localized plurality of audio signals output from the direct sound generator and the other one of the two early reflection audio signals output from the early reflection generator.

2. The apparatus according to claim 1, wherein the early reflection generator device comprises:

an HRTF unit to generate an interaural time difference (ITD) between the two audio signals;

a diffusing unit to filter the two audio signals output from the HRTF unit through all-pass filters (APFs); and a reverberating unit to exchange the two audio signals output from the diffusing unit when the two audio signals are received as feedback.

3. The apparatus according to claim 2, wherein the HRTF unit comprises:

a first low pass filter (LPF) to low pass filter one of the two audio signals;

a second LPF to low pass filter the other of the two audio signals; and a delay unit to delay the audio signal filtered through the first LPF for a predetermined period of time and to output the delayed signal.

4. The apparatus according to claim 2, wherein the diffusing unit comprises:

a first APF having a first delay value and a first gain value to filter one of the two audio signals; and a second APF having a second delay value and a second gain value to filter the other of the two audio signals.

5. The apparatus according to claim 4, wherein the reverberating unit comprises two APFs having a third delay value to exchange audio signals received as feedback by reducing the sizes of the two audio signals by a third gain value and a fourth gain value, respectively.

6. The apparatus of claim 4, wherein the first delay value and the second delay value are between approximately 5 ms and approximately 10 ms.

7. The apparatus of claim 4, wherein the first gain value and the second gain value are between zero and one.

8. The apparatus according to claim 2, wherein the HRTF unit comprises:

a first finite impulse response (FIR) filter to filter one of the two audio signals;

a second finite impulse response (FIR) filter to filter the other one of the two audio signals; and a delay unit to delay the audio signal filtered through the first FIR for a predetermined period of time and to output the delayed signal.

9. The apparatus according to claim 1, further comprising:

an output unit to output the second audio signal and the third audio signal as a stereophonic audio signal.

10. A stereophonic sound output apparatus comprising:

a head related transfer function (HRTF) unit device to generate an interaural time difference (ITD) between two audio signals;

a diffusing unit device to filter the two audio signals output from the HRTF unit through all-pass filters (APFs); and a reverberating unit device to exchange the two audio signals output from the diffusing unit when they are received as feedback;

wherein the HRTF unit device comprises:

a first low pass filter (LPF) to low pass filter one of the two audio signals;

a second LPF to low pass filter the other of the two audio signals; and a delay unit to delay the audio signal filtered through the first LPF for a predetermined period of time, and to output the delayed signal.

11. The apparatus according to claim 10, wherein the diffusing unit device comprises:

a first APF to filter one of the two audio signals, the first APF having a first delay value and a first gain value; and a second APF to filter the other of the two audio signals, the second APF having a second delay value and a second gain value.

12. The apparatus according to claim 11, wherein the reverberating unit device comprises two APFs having a third delay value to exchange audio signals received as feedback by reducing the sizes of the two audio signals by a third gain value and a fourth gain value, respectively.

13. An early reflection generation method to generate stereophonic sound signals from a plurality of multi-channel audio signals, the method comprising:

generating an interaural time difference (ITD) between two audio signals;

filtering the two audio signals through all-pass filters (APFs); and exchanging the two filtered audio signals received as feedback;

wherein the generating of the ITD comprises:

low pass filtering the two audio signals;

delaying one of the two audio signals for a predetermined period of time; and outputting the delayed signal.

14. The method according to claim 13, wherein the filtering of the two audio signals comprises:

filtering one of the two audio signals through a first APF having a first delay value and a first gain value; and filtering the other of the two audio signals through a second APF having a second delay value and a second gain value.

15. The method according to claim 14, wherein the exchanging of the two filtered audio signals comprises exchanging audio signals received as feedback by reducing the sizes of the audio signals using two APFs having a third gain value and a fourth gain value when filtering the audio signals through the two APFs having a third delay value.

16. A method of generating stereophonic sound signals from multi-channel sound signals, the method comprising:

localizing each of a plurality of audio signals using a first head related transfer function (HRTF) for each of the plurality of audio signals;

combining the plurality of audio signals to generate a first audio signal;

dividing the first signal into two audio signals using a second head related transfer function (HRTF) to generate two early reflection audio signals, wherein the two early reflection audio signals have an interaural time difference (ITD);

combining some of the localized plurality of audio signals and one of the two early reflection audio signals to generate a second audio signal;

combining other of the localized plurality of audio signals and the other one of the two early reflection audio signals to generate a third audio signal; and outputting the second and third audio signals as stereophonic sound signals.

17. The method according to claim 16, wherein the generating of the ITD comprises:

generating the interaural time difference (ITD) between the two audio signals;

filtering the two audio signals through all-pass filters (APFs); and exchanging the two filtered audio signals received as feedback.

18. A non-transitory computer readable medium comprising instructions that, when executed by a stereophonic sound output apparatus, cause the apparatus to perform the method of claim 16.

* * * * *